United States Patent [19]
Gabara

[11] Patent Number: 5,739,714
[45] Date of Patent: Apr. 14, 1998

[54] APPARATUS FOR CONTROLLING GROUND BOUNCE

[75] Inventor: Thaddeus John Gabara, Murray Hill, N.J.

[73] Assignee: Lucent Technologies, Inc., Murray Hill, N.J.

[21] Appl. No.: 547,633

[22] Filed: Oct. 24, 1995

[51] Int. Cl.$^6$ ................................................. H03K 17/16
[52] U.S. Cl. ........................ 327/384; 327/379; 327/382; 327/389; 327/310; 326/27
[58] Field of Search ............................. 327/313, 327, 327/328, 103, 310, 311, 308, 317, 334, 378, 379, 380, 381, 382, 384, 389, 391, 404, 513, 551, 552, 553, 592, 170; 326/27

[56] References Cited

U.S. PATENT DOCUMENTS

| | | | |
|---|---|---|---|
| 4,424,456 | 1/1984 | Shiraki et al. | 327/108 |
| 4,782,252 | 11/1988 | Levy et al. | 327/437 |
| 4,862,018 | 8/1989 | Taylor et al. | 327/384 |
| 5,017,807 | 5/1991 | Kriz et al. | 326/27 |
| 5,036,232 | 7/1991 | Jungert et al. | 326/21 |
| 5,059,822 | 10/1991 | Dukes | 326/86 |
| 5,068,553 | 11/1991 | Love | 326/122 |
| 5,111,075 | 5/1992 | Ferry et al. | 326/27 |
| 5,124,579 | 6/1992 | Naghshineh | 326/27 |
| 5,179,298 | 1/1993 | Hirano et al. | 326/27 |
| 5,204,554 | 4/1993 | Ohannes et al. | 326/30 |
| 5,214,320 | 5/1993 | Truong | 326/27 |
| 5,218,239 | 6/1993 | Boomer | 326/27 |
| 5,243,229 | 9/1993 | Gabara et al. | 307/98 |
| 5,283,631 | 2/1994 | Koerner et al. | 327/399 |
| 5,332,938 | 7/1994 | McEwan | 326/27 |
| 5,334,885 | 8/1994 | Morris | 326/21 |
| 5,337,254 | 8/1994 | Knee et al. | 327/538 |
| 5,345,123 | 9/1994 | Staudinger et al. | 327/308 |
| 5,428,303 | 6/1995 | Pasqualini | 326/27 |
| 5,497,105 | 3/1996 | Oh et al. | 326/27 |
| 5,517,130 | 5/1996 | Sandhu | 326/27 |
| 5,534,819 | 7/1996 | Gunter et al. | 327/379 |

*Primary Examiner*—Timothy P. Callahan
*Assistant Examiner*—Terry L. Englund
*Attorney, Agent, or Firm*—Oliff & Berridge, P.L.C.

[57] ABSTRACT

An apparatus for diminishing supply and ground bounce in integrated circuits. Two separate techniques are used simultaneously to diminish the problem of ground bounce. First impedance is placed between a power source bus on the integrated circuit and an external power source; and between a ground bus on the chip and an external ground. This effectively dampens ground bounce oscillations in the power and ground leads of the chip. Secondly, capacitance is dynamically added to the pre-drive of an output buffer with a capacitance node. Dynamic digital sizing is utilized in both techniques, therefore both techniques are responsive to the changing performance variations within the chip.

10 Claims, 5 Drawing Sheets

5,739,714

APPARATUS FOR CONTROLLING GROUND BOUNCE

TECHNICAL FIELD

This invention is directed to integrated circuits, and more particularly integrated circuits which meet the design requirements for higher bandwidth, by controlling ground bounce.

BACKGROUND OF THE INVENTION

There is a trend toward the use of higher bandwidth devices in integrated circuit(chip) technology. As a result, bus widths on integrated circuits have been increasing. The bus width on integrated circuit technology such as a CMOS chip for example, is approaching 128 bits. To meet this demand for increased throughput, more data paths leading out of the integrated circuit will have to be made available to carry additional data. Therefore, more connections have to be established between the integrated circuit and a printed circuit board (i.e. 128 bits, require 128 connections). However, with the increase in circuit connections comes an increase in the parasitic effects (ie.capacitance and inductance), associated with these circuit connections.

The parasitic effect caused by electrons traversing the connection between a chip and the printed circuit board is usually modeled by an inductor placed in series with a capacitor. FIG. 1 displays a typical method of connecting a chip to a printed circuit board. In FIG. 1, a chip 10 housed in a plastic packaging 15 is connected to a printed circuit board 20. A bonding wire 30 connects the chip to a lead 40 which in turn connects to the printed circuit board 20. Electrical signals (bits) that represent data (0's and 1's) are normally manipulated in an output buffer 50 and then transferred to the bonding wire 30, through a pad 60. The bits are then transmitted to the printed circuit board 20 through the lead 40. The chip is connected through the pad 130 to the external power 70 and through the pad 140 to the external ground 80. The leads on a chip are often designed to be used as data, control, power and ground leads. On many chip designs power and ground leads can consume 30–40% of the total leads. Therefore, as the bus width of the chip increases the amount of leads utilized for ground and power are increased, and the parasitic effects of each lead is increased.

FIG. 2 presents a model of the parasitic effects resulting from electrons traversing the connection between the chip 10 and the printed circuit board 20. In FIG. 2 the parasitic model is connected between an external power source 70 and an external ground 80. The connection of the data buffer to the pad is displayed by 50 and 60, respectively. The parasitic effects resulting from the connections between the bonding wire 30, lead 40 and printed circuit board 20 of FIG. 1, are modeled by the inductor 110 in series with the capacitor 120, of FIG. 2. Since there are several connections between a chip and a printed circuit board, the circuit in FIG. 2 would realistically be represented by a number of circuits in parallel. However, for the sake of simplicity the parasitic effects of a single connection is displayed. The data buffer 50 is usually composed of a pre-driver 90 and an output-driver 100. Through the combination of the a pre-driver 90 and an the output-driver 100 the data buffers 50 are capable of manipulating data. There are also parasitic effects resulting from the chip connection to the external power (external $V_{DD}$) source 70 and external ground (external $V_{SS}$) 80. These connections are accomplished through the pads 130 and 140; and are modeled by the inductors 150 and 160.

As data is transmitted from the chip to the circuit board, the capacitor 120 of FIG. 2 charges/discharges. The charging/discharging, causes a voltage shift across the inductors 110 as the energy is routed through the chip. Ultimately this energy is routed to the inductor 150, in the case of a charging scenario; or the inductor 160, in a discharging scenario. The RLC tank circuit formed by components 150, 160, 110 and 120 and an output driver 100 becomes energized and generates under-damped voltage oscillations to occur on either internal ground bus 180 or internal power bus 170. When the magnitude of the oscillation increases it becomes harder to determine whether the data being received from the chip is a zero or a one. Therefore the integrity of the data is compromised. This phenomena is known as ground bounce.

Some designers have addressed the ground bounce problem by manipulating the output buffer. FIG. 3 displays a circuit implementation of a prior art output buffer. The output buffer 50 is composed of a pre-driver 90 and an output-driver 100. To reduce the ground bounce effect, the size of the pre-driver 90 is scaled to be 15 to 20 times less than the size of the output-driver 100, however this prevents the buffer from operating at higher data processing frequencies. FIG. 4 models the output-driver 100 shown in FIG. 3. The output drivers 100 are connected between the external power source 70 and the external ground 80, and are modeled by switches 200 displayed in series with an active resistance. Each switch 200 in series with an active resistance 190, represents one of the Metal-Oxide Semiconductor Field Effect Transistors(MOSFET's) in the output-drive 100 of FIG. 3. After completion of a switching event there is a zero voltage drop across the active resistors 190 therefore the voltage across the active resistor 190 is normally strapped to the external power source 70 or the external ground 80. Designers have avoided design configurations leading to any significant passive or active resistance between the internal power and ground bus and the external power source and external ground terminals. The chip is constantly drawing an average DC current denoted by 75 of FIG. 4. Any resistance above contact resistance could cause a voltage drop across the resistors, which would effect the DC performance of the circuit. The voltage drop would produce a shift in the internal voltage (170,180 of FIG. 2) of the chip corrupting the integrity of the data. Therefore, the only resistance that would normally be present in the power and ground terminals would be the naturally occurring resistance (i.e. contact resistance, resistance of the bonding wire, resistance of the lead, resistance in the power and ground bus), which is normally in the milli-ohm range.

The ground bounce problem is further exacerbated by the existence of power, voltage and temperature (PVT) extremes. The active resistance 190 is a function of the PVT. The value of the active resistance 190 will determine whether an oscillation which causes supply or ground bounce will occur at the power bus 170 or the ground bus 180, respectively. Although the same design can be implemented in two different chips, the chips are usually not manufactured identically. Typically, the active resistance 190 can vary by a factor of three in two different chips with the same design. At one extreme a chip could operate in a Worst Case Slow (WCS) state. In WCS conditions the resistance 190 is large and the chip circuitry is critically over-damped. In the over-damped state the chip is manufactured as a long channel device, and processes data (switching from the zero state to the one state) slowly as a result of low voltage and high temperature conditions. On the other extreme the chip is operating in a Best Case Fast (BCF) state. In the BCF state the resistance 190 is reduced, which causes oscillatory behavior to be realized at the power and ground buses. When the chip is operating in the BCF state the chip is under-damped. Under BCF conditions, the chip is manufactured with a short channel, and processes information at a fast rate as a result of high voltage and low temperature. Designers have to design a chip that will function under the full range of manufacturing variation, from WCS to BCF.

SUMMARY OF THE INVENTION

Two techniques either alone or in combination are used to diminish ground bounce in an integrated circuit. Impedance is placed between a power bus on the chip and an external power source; and the ground bus on the chip and an external ground. The impedance is composed of active circuit elements and/or, passive circuit elements. Secondly, dynamic digital sizing is utilized to vary capacitance on the pre-drive node of the output buffer, to further reduce ground bounce.

BRIEF DESCRIPTION OF THE DRAWINGS

The objects, advantages and novel features of the invention will be more fully apparent from the following detailed description when read in connection with the accompanying drawings wherein.

DETAILED DESCRIPTION OF THE INVENTION

In the present invention the effective resistance at the external terminals is modified as chip operational conditions change, by utilizing a transistor sizing technique that adjusts the impedance. This technique compensates for the decaying oscillations caused by ground bounce, by dampening the oscillations. In addition to dynamically adding impedance to the external terminals, an additional reduction in oscillations of about 25% is achieved by adding capacitance onto the pre-drive node of the output buffer, as the chip progresses from the WCS to BCF conditions. The addition of this capacitance to the pre-drive node slows the charging of the output driver and provides an additional control in the rise/fall time of the output waveform generated at the pad. The additional capacitance helps to reduce the ground bounce during BCF conditions. At WCS conditions, the capacitance is disabled by disconnecting these capacitance circuit elements from the pre-drive node, thereby allowing the circuit to operate without the imposed capacitance delay.

An illustrative embodiment of the invention is disclosed with a block diagram. The block diagram includes a reference circuit which generates a control signal, a power and ground impedance modules which add resistance to external terminals of the integrated circuit, and an output buffer which buffers data output.

Figure 1:
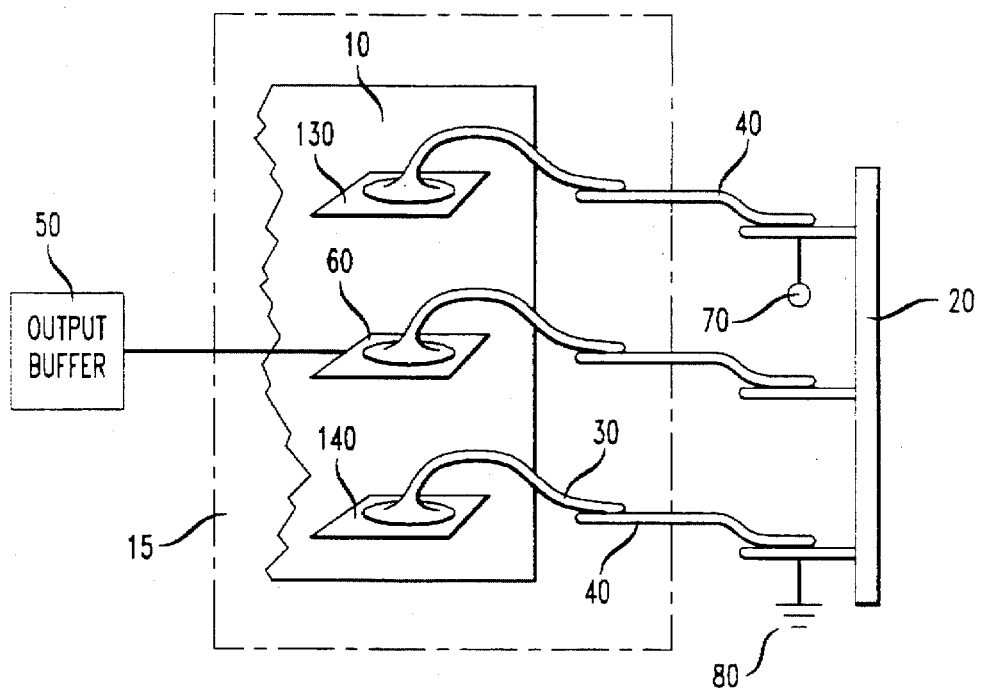
FIG. 1. displays a typical connection between a chip and a printed circuit board.
Figure 2:
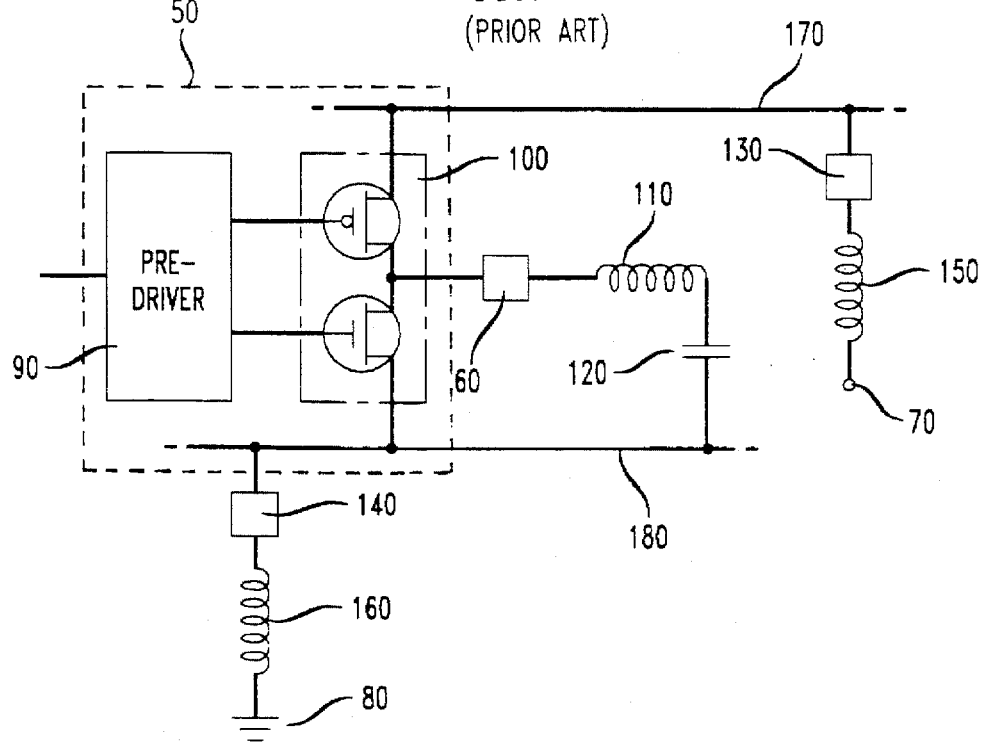
FIG. 2. displays a model of electrical signals traversing the connection displayed in FIG. 1, which highlights the parasitic effects of the connection.
Figure 3:
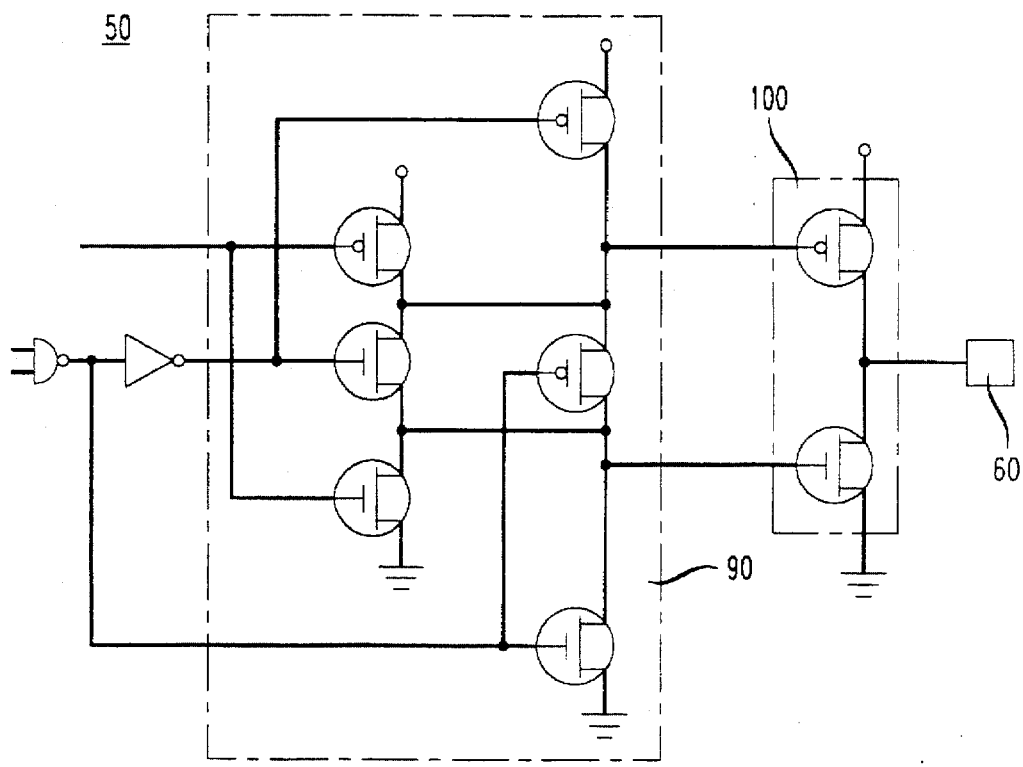
FIG. 3. displays a circuit implementation of one prior art output buffer.
Figure 4:
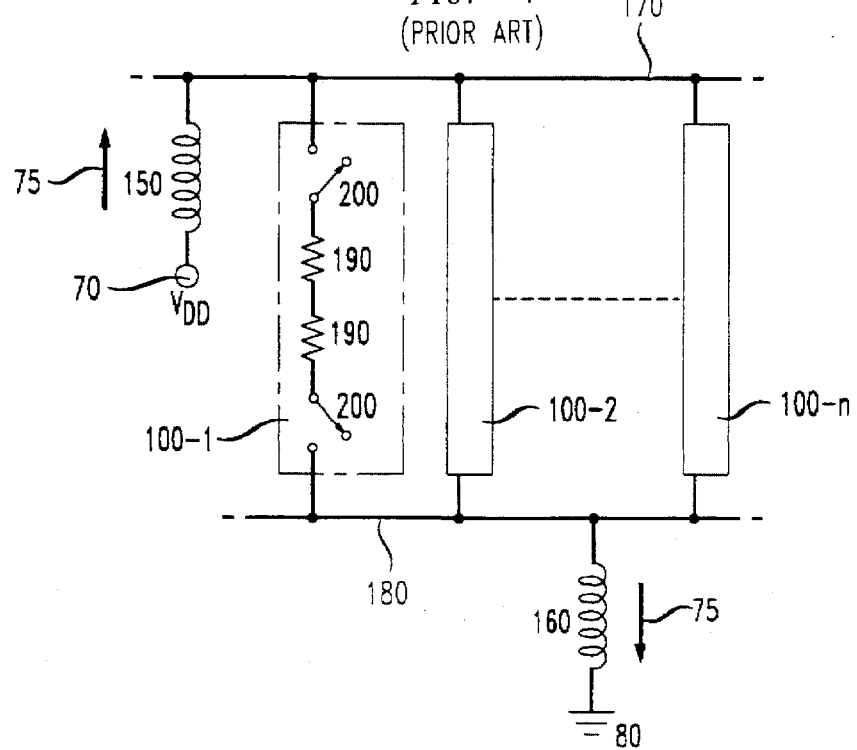
FIG. 4. displays a model of the output-driver displayed in FIG. 3.
Figure 5:
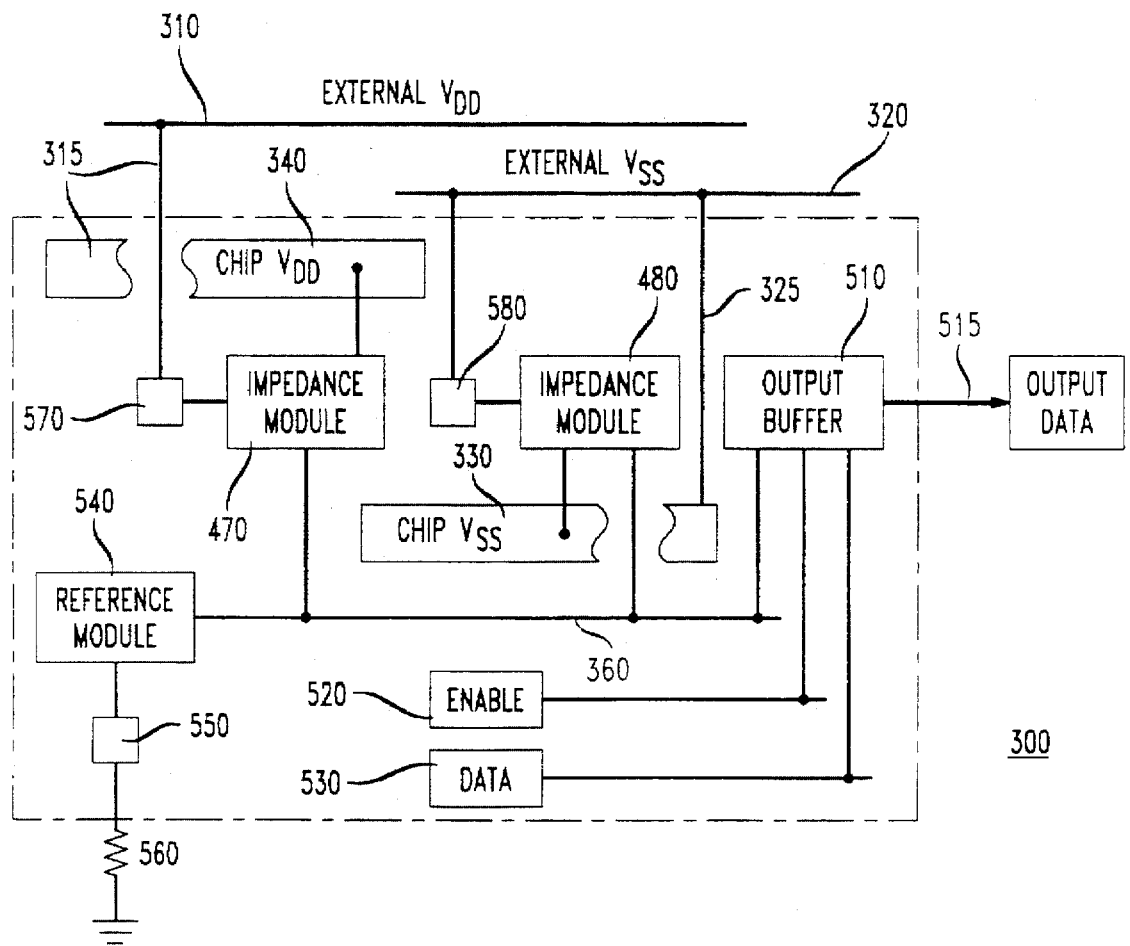
FIG. 5. the overall architecture of the present invention.

The operational aspects of this embodiment are highlighted in the block diagram of FIG. 5. A chip 300 includes an internal power bus 340 and internal ground bus 330. An external power source 310 and the external ground 320 are also displayed. A reference resistor 560 which is external to the chip 300, is connected to a reference module 540 through a pad 550. The reference module 540 produces a control signal 360 which controls the dynamic digital sizing of the impedance modules, 470, 480; and the capacitance node in the output buffer 510. The power impedance module 470 is connected between the internal power bus 340 and the external power source 310 through the pad 570. Sending the control signal 360 to the power impedance module 470 results in the dynamic digital sizing of the power impedance module 470. This dynamically generates an impedance between internal power bus 340 and external power source 310 to reduce ground bounce. The chip is dynamically sized utilizing for example the dynamic digital sizing technique disclosed in Gabara et al. U.S. Pat. No. 5,243,229, entitled "Digitally controlled Element Sizing," issued Sep. 7, 1993; which is hereby incorporated by reference. In other words, a number of MOSFET's are brought into the circuit to add a controlled amount of impedance between the internal power bus 340 and the external power source 310.

Similar to the power impedance module 470, a ground impedance module 480, is connected by pad 580, between the internal ground bus 330 and the external ground 320. A dynamic digital sizing technique is utilized in the ground impedance module 480. It should be appreciated that the power impedance module 470 and the ground impedance module 480 represent in block diagram form either a plurality of passive impedance elements such as resistors, a plurality of active impedance elements such as MOSFET's, or a plurality of passive impedance elements in parallel with active impedance elements. In addition, the impedance presented at the terminals by the impedance modules would be greater than the naturally occurring resistance that would be present. Typically resistance in the range of 0.5 ohm to 30 ohms are employed.

In FIG. 5, output buffer 510 is controlled by control signal 360 in conjunction with an enable signal 520, and an input data signal 530. The output buffer 510 manipulates the input data signal 530 to meet any external design requirements. For example, the output buffer 510 can control the rise and fall time of the data signal 515, shift the voltage level of the data signal 515, or apply impedance to the data signal 515. Capacitance is added on a pre-driver in the output buffer, by a digitally controlled element sizing technique. The capacitance node has the effect of controlling the rise and fall time of the signal 515.

Figure 6:
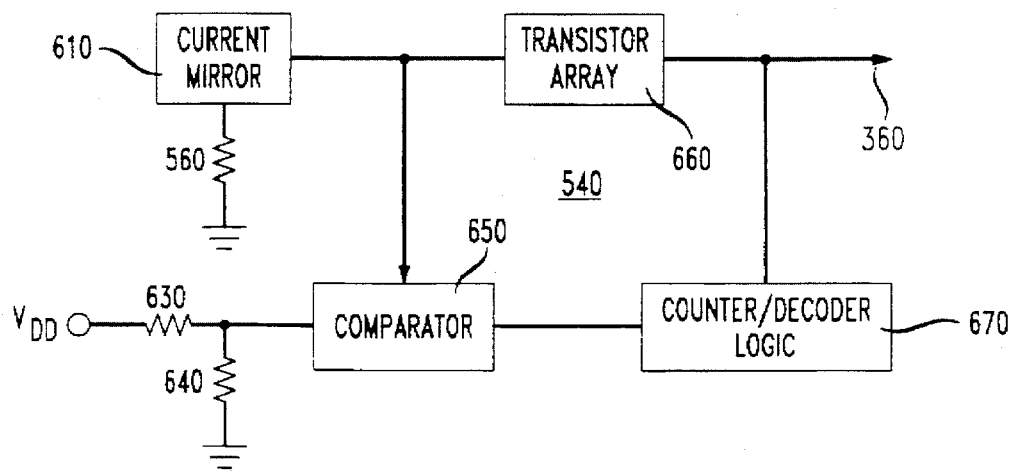
FIG. 6. displays a block diagram of the reference module 540 utilized in the present invention.

The control signal utilized throughout the integrated circuit is generated by, for example the reference circuit in FIG. 6. In FIG. 6, a current mirror 610 multiplies a signal generated through an reference resistor 560 (located off of the chip), and sends this signal to a transistor array 660 and the comparator 650. The comparator 650 compares the signal produced at the junction of 610 and 660 with the signal read from a point between resistors 630 and 640, which is a wheatstone bridge. When there is a difference in these signals the comparator generates a signal to the counter/decoder logic module 670 which generates a control signal 360 to compensate for the signal difference in comparator 650. The transistor array 660 is implemented with MOSFET technology, however, it will be appreciated that any other technology could be utilized. The transistor array 660 is also responsive to the control signal 360. Therefore, by using the comparator 650 to monitor on-chip variations and then utilizing the counter/decoder logic module to accommodate for those variations; the transistor array 660 is dynamically sized to compensate for any PVT variations in the chip.

Figure 7:
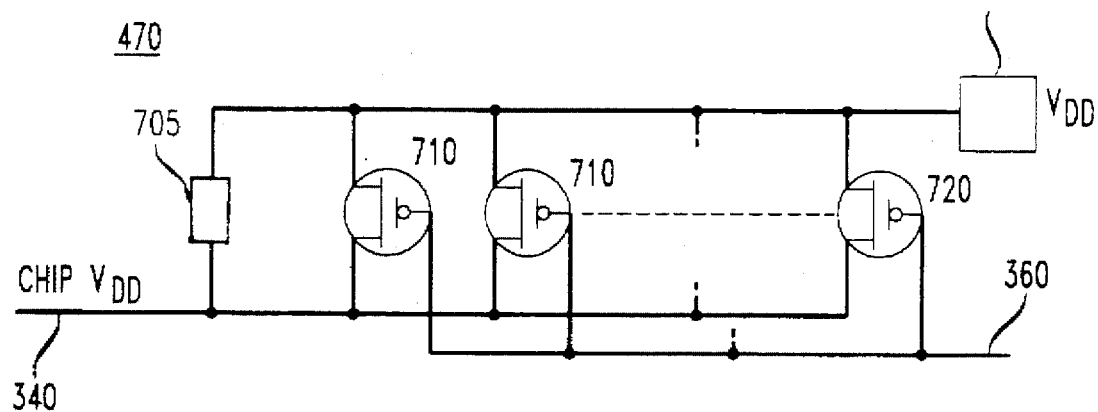
FIG. 7. displays the power impedance module 470 of FIG. 5, implemented using MOSFET's.
Figure 8:
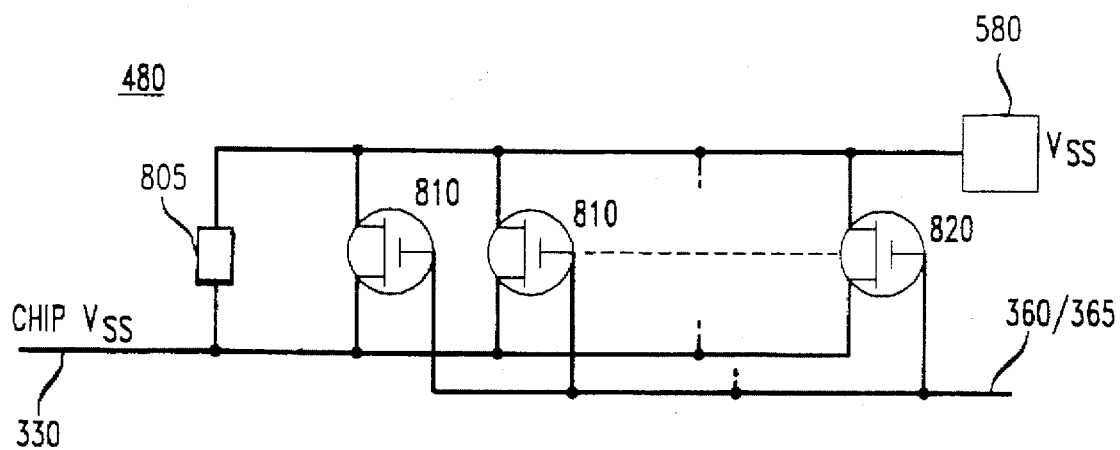
FIG. 8 displays the ground impedance module 480 of FIG. 5, implemented with MOSFET's.

The control signal 360 delivers a signal to the power impedance module 470 of FIG. 7, thereby controlling which of the MOSFET's turn on and become part of the circuit. A passive impedance 705, which may be a resistor or, alternatively, an FET with its gate tied such that it is always on and in its resistive state, supplies some impedance above the naturally occurring resistance to the circuit. The additional MOSFET's are responsive to the control signal 360 and are added into the circuit to dynamically adjust the overall impedance. It should be appreciated that the MOSFET's can have different impedance values. For example, the coarse adjustment MOSFET's 710 may provide four times less the impedance as the fine adjustment MOSFET's 720. FIG. 8 displays the impedance module 480 which is connected between the internal ground bus 330 and the external ground bus 320. A second passive impedance 805, which may be a resistor or, alternatively, an FET tied such that it is always on, is included so the ground impedance module 480 is always providing a minimum impedance value which is greater than any naturally occurring resistance by about 0.5 ohm. The ground impedance module 480 may have all the MOSFET's carrying the same impedance values or may separate the MOSFET's into coarse adjustment MOSFET's 810 and fine adjustment MOSFET's 820. It should be noted that a given chip may have a plurality of power impedance modules 470 and ground impedance modules 480 active in the circuit simultaneously.

Figure 9:
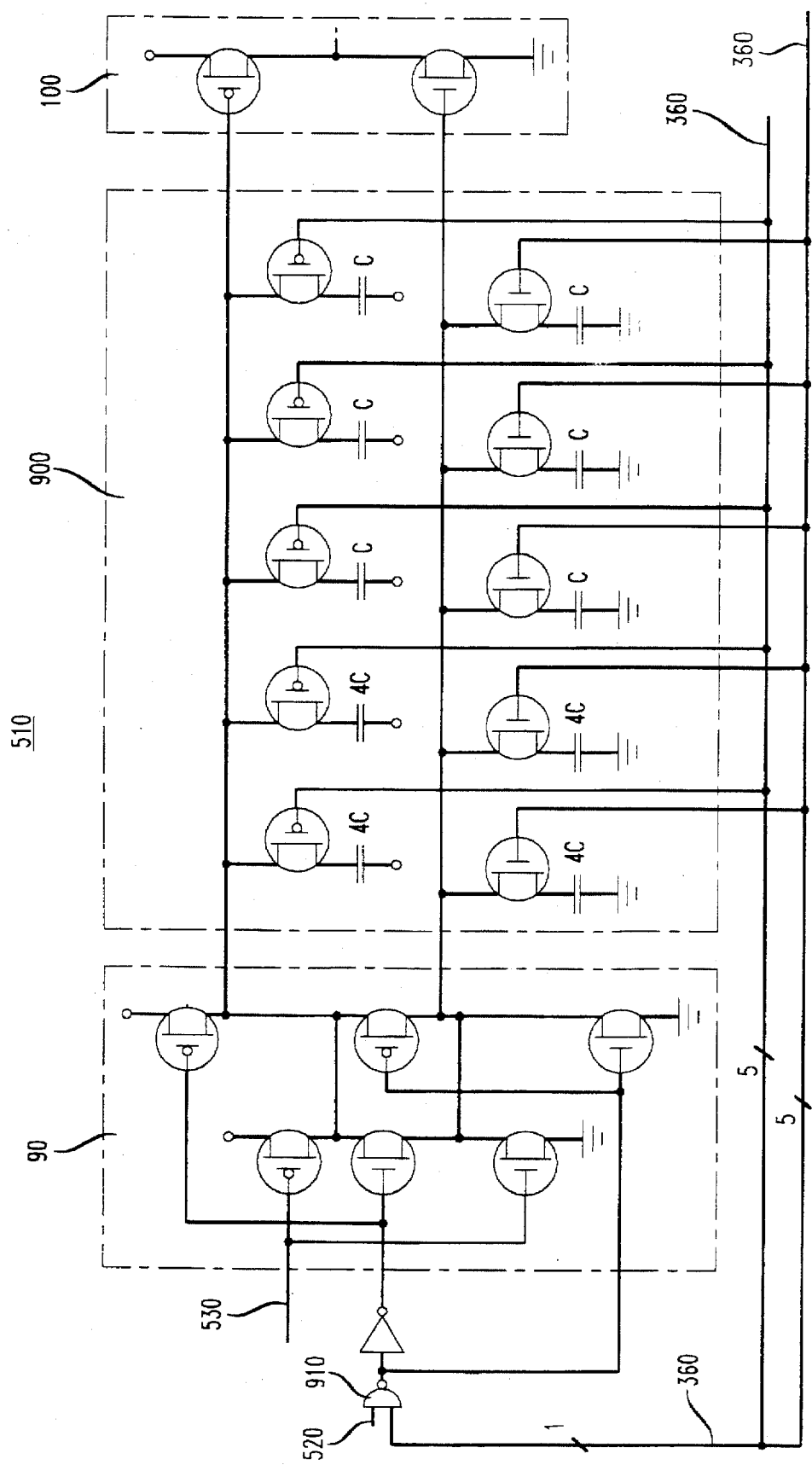
FIG. 9 displays a dynamic sizing circuit utilized in the output buffer 510 of FIG. 5.

Final data manipulation occurs in the output buffer displayed in FIG. 9. A pre-driver 90, an output driver 100, and a capacitance adjustment component 900 are located in the output buffer 510 of FIG. 5. The pre-driver 90 is responsive to the control signal 360 and input data signal 530. An enabling signal 520 is logically combined with the control signal 360 so that the entire pre-driver 90 can be disabled if necessary. In one embodiment this logical combination is performed with a NAND gate 910. The entire output buffer 510 is implemented with MOSFET technology, however it will be appreciated that other active technologies such as JFET's, can be utilized to implement the invention.

The capacitance adjustment component 900 is added or subtracted from the output buffer 510 by utilizing the technique of dynamic digital sizing. Therefore, the capacitance adjustment component 900 can load the pre-drive node with capacitance to provide control to the output buffer, and dynamic control to the chip. The capacitance 900 which adds capacitance to the pre-driver 90 is composed in one embodiment of both fine adjustment elements which are denoted by 4C and coarse adjustment elements which are denoted by C. The coarse adjustment elements add for example 4 times the capacitance of the fine adjustment elements. Typically this is about 0.05 to 0.15 picofarad for the fine adjustment elements and the coarse adjustment elements deliver between about 0.2 to about 0.6 picofarad for a family of I/O buffers. Capacitance less than 0.05 and 0.2 respectively generally lead to a WCS state of operations while capacitance's above 1.5 and 0.6 respectfully yield BCF state of operations.

A digitally controlled capacitance is added to the pre-drive node to slow down the output driver 100 when there is a BCF manufactured chip. The capacitance is applied by enabling all switches, thereby loading the pre-drive node with a capacitance node, of 11C in value. If the chip is at the WCS state, the objective is to quicken its switching characteristics by minimizing the capacitance load to a minimum (i.e. all switches disabled), thereby giving a capacitance load of 0C. Anywhere in between the BCF and WCS state, the weight of the digital control monotonically increases the capacitance load imposed on the pre-drive node.

While several embodiments of the invention are disclosed and described, it should be appreciated that various modifications may be made without departing from the spirit of the invention or the scope of the subjoined claims.

What is claimed is:

1. An integrated circuit device having at least one output buffer and first and second voltage source buses, said device comprising:
    at least one adjustable resistive element coupled to a respective one of said first and second voltage source buses, said at least one adjustable resistive element further coupled to corresponding first and second voltage supplies outside of said device, wherein said at least one adjustable resistive element is adjustable to maintain a particular resistance value to compensate for fabrication tolerances of the device and operating conditions of the device in order to damp ground bounce on said respective first or second voltage source buses produced by switching operation of said at least one output buffer.

2. The device of claim 1, wherein said at least one adjustable resistive element includes at least one active element.

3. The device of claim 1, wherein said at least one adjustable resistive element includes at least one passive element.

4. The device of claim 1, wherein said at least one adjustable resistive element provides a resistance value in a range for compensating for operating conditions of differing voltage sources and temperature.

5. The device of claim 1, wherein said at least one adjustable resistive element provides a resistance value in a range of approximately 0.5 Ω to 30 Ω.

6. The device of claim 1, wherein said first and second voltage source buses are ground buses.

7. An electronic assembly, comprising:
    an integrated circuit device interconnected to a substrate, said device having at least one output buffer and a first and a second voltage source bus, said device comprising at least one adjustable resistive element coupled to a respective one of said first and second voltage source buses, said at least one adjustable resistive element further coupled to corresponding first and second voltage supplies outside of said device, wherein said at least one adjustable resistive element is adjustable to maintain a particular resistance value to compensate for fabrication tolerances of the device and operating conditions of the device in order to damp ground bounce on said respective first or second voltage source buses produced by switching operation of said at least one output buffer; and
    a reference resistor coupled to a reference voltage source and said integrated circuit device, said reference resistor and said reference voltage source providing a control signal to said device for adjusting said at least one adjustable resistance element to maintain said particular resistance value.

8. An integrated circuit device having at least one output buffer, said at least one output buffer comprising:

an output driver;

a pre-driver; and an adjustable capacitive element coupled to said pre-driver, said output driver and a voltage source bus of said device, said adjustable capacitive element being adjustable to maintain a desired rise and fall rate for signals transmitted from said pre-driver to said output driver, wherein said adjustable capacitive element provides a capacitance value that produces said desired rise and fall rate to reduce ground source by approximately 25% relative to a device without such capacitive element.

9. An integrated circuit device having at least one output buffer, said at least one output buffer comprising:

an output driver;

a pre-driver; and an adjustable capacitive element coupled to said pre-driver, said output driver and a voltage source bus of said device, said adjustable capacitive element being adjustable to maintain a desired rise and fall rate for signals transmitted from said pre-driver to said output driver, wherein said adjustable capacitive element provides a capacitance value in a range of approximately 0 to 1.5 pF.

10. An electronic assembly, comprising:

an integrated circuit device interconnected to a substrate, said device having at least one output buffer, said at least one output buffer comprising:

an output driver;

a pre-driver; and an adjustable capacitive element coupled to said pre-driver, said output driver and a voltage source bus of said device, said adjustable capacitive element being adjustable to maintain a desired rise and fall rate for signals transmitted from said pre-driver to said output driver; and a reference resistor coupled to a reference voltage source and said integrated circuit device, said reference resistor and said reference voltage source providing a control signal to said device for adjusting said adjustable capacitive element for maintaining said desired rise and fall rate for signals transmitted from said pre-driver to said output driver.

* * * * *